(12) United States Patent
Yang et al.

(10) Patent No.: US 10,068,900 B1
(45) Date of Patent: Sep. 4, 2018

(54) SEMICONDUCTOR DEVICE WITH DUMMY PATTERN IN HIGH-VOLTAGE REGION AND METHOD OF FORMING THE SAME

(71) Applicant: UNITED MICROELECTRONICS CORP., Hsinchu (TW)

(72) Inventors: Chin Yang, Tainan (TW); Chao-Sheng Cheng, Taichung (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 60 days.

(21) Appl. No.: 15/437,824

(22) Filed: Feb. 21, 2017

(51) Int. Cl.
  *H01L 29/78* (2006.01)
  *H01L 27/088* (2006.01)
  *H01L 29/423* (2006.01)
  *H01L 29/66* (2006.01)
  *H01L 21/8234* (2006.01)

(52) U.S. Cl.
  CPC .... *H01L 27/088* (2013.01); *H01L 21/823437* (2013.01); *H01L 29/42356* (2013.01); *H01L 29/6656* (2013.01); *H01L 29/66545* (2013.01); *H01L 29/7801* (2013.01)

(58) Field of Classification Search
  CPC ................. H01L 21/70; H01L 21/8232; H01L 29/66007; H01L 29/66409
  See application file for complete search history.

(56) References Cited

U.S. PATENT DOCUMENTS

| 6,259,115 | B1 | 7/2001 | You et al. | |
| 2013/0320443 | A1* | 12/2013 | Levin | .................. H01L 27/088 257/337 |

* cited by examiner

*Primary Examiner* — Cheung Lee
(74) *Attorney, Agent, or Firm* — WPAT, PC (57) ABSTRACT

A semiconductor device includes a substrate having a high-voltage (HV) region; HV gate structures formed in the HV region of the substrate; a HV dummy pattern disposed in the HV region, and the HV dummy pattern comprising at least a semiconductor portion and a dummy HM stack disposed on the semiconductor portion, wherein a height ($h_S$) of the semiconductor portion of the HV dummy pattern is smaller than a height ($h_{HV\text{-}g}$) of a HV gate electrode of one of the HV gate structures.

27 Claims, 8 Drawing Sheets

SEMICONDUCTOR DEVICE WITH DUMMY PATTERN IN HIGH-VOLTAGE REGION AND METHOD OF FORMING THE SAME

BACKGROUND

Field of the Invention

The disclosure relates in general to a semiconductor device and a method of forming the same, more particularly to a semiconductor device with dummy pattern in a HV region of a substrate and a method of forming the same.

Description of the Related Art

Sizes of semiconductor devices have been decreased for these years. Reduction of feature sizes and improvements of density and cost per integrated circuit unit are important goals in the semiconductor technology. The electrical properties of devices have to be maintained even improved with the decrease of sizes to meet the requirements of commercial products in applications. For example, layers and components with damages, which have considerable effects on electrical performances, would be one of many important issues for device manufacturers. Generally, a semiconductor device with good electrical performance requires elements of complete profiles.

According to typical manufacturing methods, different gate heights of gates in different regions of a substrate would cause damage to the gates. It is known that gate structures of a semiconductor device with flawed profiles and insufficient gate heights will cause considerable deterioration on electrical properties of the devices. It is thus desirable to conquer the gate height issue by developing a manufacturing method compatible with processes of forming different gate-height cells in different regions of a substrate.

SUMMARY

The disclosure relates to a semiconductor device with a dummy pattern in the high-voltage (HV) region and a method of forming the same. During formation of the semiconductor device, a dummy hardmask (HM) pattern is disposed in the HV region, and it is not necessary to form a conventional cap oxide layer in the HV region.

According to an embodiment, a semiconductor device is provided, comprising a substrate having a high-voltage (HV) region; HV gate structures formed in the HV region of the substrate; and a HV dummy pattern disposed in the HV region, and the HV dummy pattern comprising at least a semiconductor portion and a dummy HM stack disposed on the semiconductor portion, wherein a height of the semiconductor portion of the HV dummy pattern is smaller than a height of a HV gate electrode of one of the HV gate structures.

According to an embodiment, a method for forming a semiconductor device is provided, comprising: providing a substrate and a first semiconductor layer disposed above the substrate, and the substrate having a high-voltage (HV) region; disposing a patterned hardmask (HM) above the first semiconductor layer; defining a HV dummy pattern in the HV region by using the patterned HM, wherein the HV dummy pattern comprises at least a semiconductor portion and a dummy HM stack disposed on the semiconductor portion; disposing a second semiconductor layer; providing an etching mask in the HV region, and defining the second semiconductor layer by using the etching mask to form HV gate structures on the substrate, wherein a height of the semiconductor portion of the HV dummy pattern is smaller than a height of a HV gate electrode of one of the HV gate structures.

According to a further embodiment, a semiconductor device is provided, comprising a substrate having a high-voltage (HV) region; HV gate structures formed in the HV region of the substrate; a HV dummy pattern disposed in the HV region. The HV dummy pattern comprises a semiconductor portion disposed above the substrate; a dummy HM stack disposed on the semiconductor portion; first spaces disposed on sidewalls of the dummy HM stack and sidewalls of the semiconductor portion; and second spacers disposed on sidewalls of the first spaces, wherein the first spaces comprise at least a dielectric material, and the second spacers comprise a semiconductor material.

The disclosure will become apparent from the following detailed description of the preferred but non-limiting embodiments. The following description is made with reference to the accompanying drawings.

DETAILED DESCRIPTION

Figure 1:
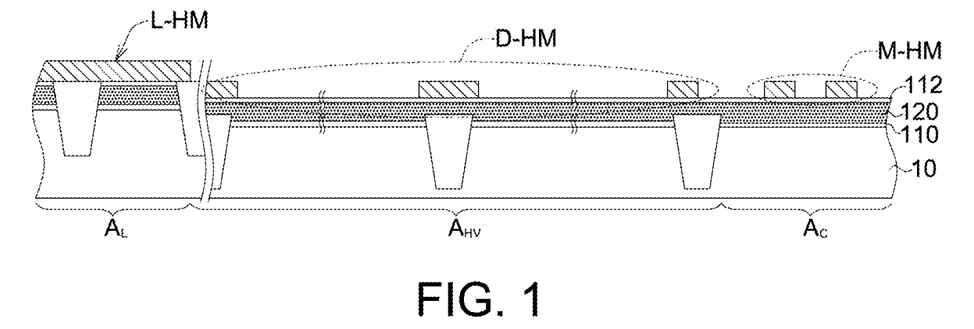
FIG. 1 is a simple drawing showing hardmask patterns formed above a substrate according to one embodiment of the present disclosure.

According to the embodiments of the present disclosure, a semiconductor device with dummy structures in the HV region of a substrate is provided. FIG. 1 is a simple drawing showing hardmask patterns formed above a substrate according to one embodiment of the present disclosure. A substrate 10 having a logic region $A_L$, a high-voltage (HV) region $A_{HV}$ and a memory cell region $A_C$ is illustrated in FIG. 1A. According to the embodiment, a patterned hardmask layer is formed above the substrate 10 and the patterned hardmask layer comprises dummy hardmask patterns D-HM (such as SiN hardmask patterns) formed in the HV region $A_{HV}$ and hardmask patterns M-HM for defining positions of floating gates (FG) of flash memory cells in the memory cell region $A_C$. After the patterned hardmask layer is formed, the flash memory cells in the memory cell region $A_C$ can be defined and formed by several procedures (such as wordline chemical mechanical polishing (WL CMP) and WL etching back and etc.; and the details of related procedures would be described later) without forming a conventional cap oxide on the polysilicon layer (for forming the HV gate electrode) in the HV region $A_{HV}$.

Figure 2:
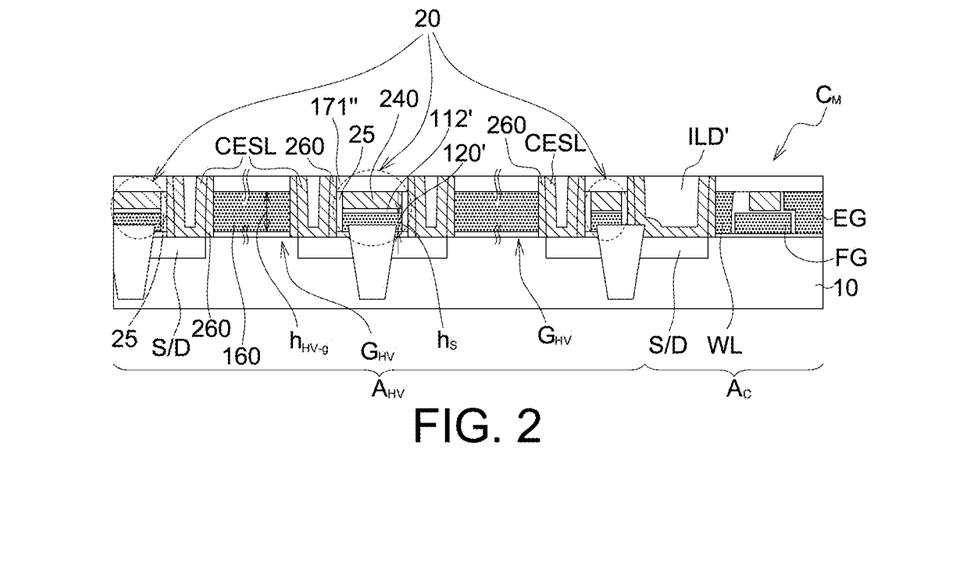
FIG. 2 simply depicts one of the structural configurations in the HV region and the memory cell region according to one embodiment of the present disclosure.

FIG. 2 simply depicts one of the structural configurations in the HV region and the memory cell region according to one embodiment of the present disclosure (details of the related layers in FIG. 2 are described hereinafter). According to the embodiment, a final product of the semiconductor device comprises at least one HV dummy pattern (ex: a multilayer stack comprising a patterned first polysilicon layer 120', a patterned second insulating layer 112' and a dummy HM 240) and at least one HV gate structure $G_{HV}$ disposed in the HV region $A_{HV}$, wherein the HV dummy pattern comprises a semiconductor portion 120' and a dummy HM stack (ex: comprising the patterned second insulating layer 112' and the dummy HM 240) disposed above the semiconductor portion 120'. In one of applicable examples, the HV dummy pattern may comprise a continuous semiconductor layer (as the semiconductor portion) and a dummy HM stack disposed on the semiconductor portion, wherein in a top/layout view the HV dummy pattern is positioned at the outsides of the HV gate structures and surrounds the HV gate structures (i.e. Type 1; described in the first embodiment below). Alternatively, the HV dummy pattern may comprise a plurality of dummy structures discretely distributed in the HV region in a top/layout view, and each of the dummy structures at least comprises a semiconductor small section (ex: in form of bump or stripe or other shapes; such as a polysilicon bump in a height of about 200 Å) and a dummy HM stack disposed on the semiconductor small section (i.e. the semiconductor portion as mentioned above is comprised of several semiconductor small sections of the dummy structures in some embodiments)(i.e. Types 2-4; described in the second-fourth embodiments below).

Each of the HV gate structure comprises a HV gate electrode (such as a metal gate or a polysilicon gate in a height of about 450 Å or more) disposed above the substrate 10. According to the embodiment, a height $h_S$ of the semiconductor portion (a continuous semiconductor layer or the semiconductor small sections) of the HV dummy pattern is smaller than a height $h_{HV-g}$ of a HV gate electrode of a HV gate structure in the HV region $A_{HV}$. Thus, for different regions of the substrate 10, no gate height loss occurs at the HV gates, the flash memory cell gates and logic gates in the structure by applying the embodied designs (including the embodied structures and related fabricating method), and the structure having elements with complete profiles (such as the gates in different regions having sufficient gate heights and complete profiles) possesses good electrical properties.

Several embodiments are provided hereinafter with reference to the accompanying drawings for describing the related procedures and configurations. Related structural details such as layers and spatial arrangement are further described in the embodiments. According to the embodiments, four types of arrangements of HV dummy pattern distributed in the HV region are disclosed herein for illustration. The HV dummy pattern distributed in the HV region could be positioned outside the HV gate structures and spaced apart from the HV gate structures (Types 1 and 2; described in the first and second embodiments); or could be positioned inside (within) the HV gate structure (Type-4; described in the fourth embodiment) and spaced apart from the HV gate structure; or could be disposed in the large area of the HV region including the insides and outsides of the HV gate structures (Type 3; described in the third embodiment). However, the present disclosure is not limited to those illustrated in the drawings. It is noted that not all embodiments of the invention and the applications are shown. There may be other embodiments of the present disclosure which are not specifically illustrated. Modifications and variations can be made without departing from the spirit of the disclosure to meet the requirements of the practical applications. It is also important to point out that the illustrations may not be necessarily be drawn to scale. Thus, the specification and the drawings are to be regard as an illustrative sense rather than a restrictive sense.

Moreover, use of ordinal terms such as "first", "second", etc., in the specification and claims to describe an element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

First Embodiment

In the first embodiment, the dummy hardmask patterns D-HM (ex: SiN hardmask patterns) are disposed in the HV region during definition of the floating gate in the memory cell region, and it is not necessary to form a conventional cap oxide layer in the HV region. The method of the embodiment also leads to a HV dummy pattern remained in the HV region for the final configuration of the semiconductor device.

Figure 3:
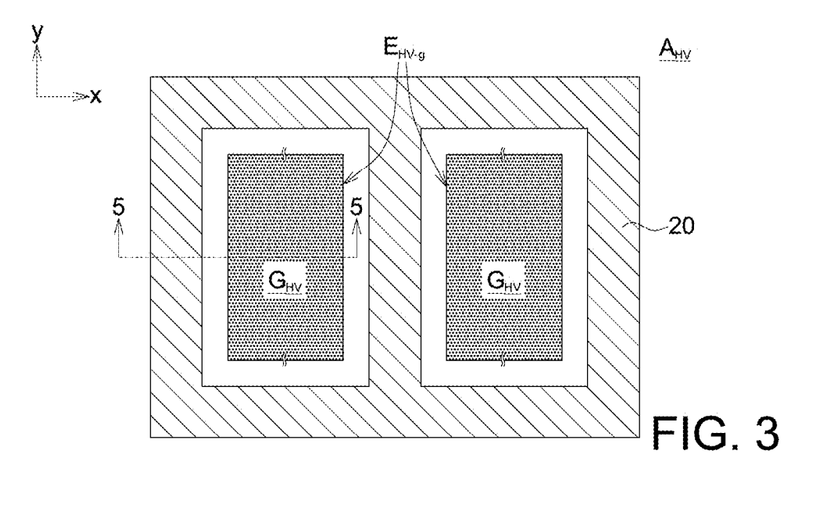
FIG. 3 is a top view showing a HV gate structure and a HV dummy pattern in the HV region of a semiconductor device according to the first embodiment of the disclosure.

FIG. 3 is a top view showing a HV gate structure and a HV dummy pattern in the HV region of a semiconductor device according to the first embodiment of the disclosure. In the first embodiment, a HV dummy pattern 20 distributed in the HV region $A_{HV}$ could be positioned outside the HV gate structures $G_{HV}$ and spaced apart from the edges $E_{HV-g}$ of the HV gate structures $G_{HV}$ (ex: by at least 0.3 μm or other numerical values suitable for practical application) from the top view of the substrate (Types 1 and 2; first and second embodiments). In one example, a HV dummy pattern 20 of the first embodiment comprises a continuous semiconductor layer (120' in FIG. 4G, as the semiconductor portion) positioned at the outsides of the HV gate structures $G_{HV}$ and surrounding the HV gate structures $G_{HV}$ (ex: two HV gate structures $G_{HV}$ are exemplified in FIG. 3 for illustration, but the actual numbers of the HV gate structures are not limited in the applications), and a dummy HM stack disposed on the continuous semiconductor layer (please also see the semiconductor portion (ex: 120') and the dummy HM stack as shown in FIG. 4G). According to a final product of the embodiment, as exemplified by FIG. 4G later, a height $h_S$ of the semiconductor portion (ex: 120') is smaller than a height $h_{HV-g}$ of a HV gate electrode (ex: the second semiconductor layer 160) of one (/each) of the HV gate structures $G_{HV}$.

Figure 4A:
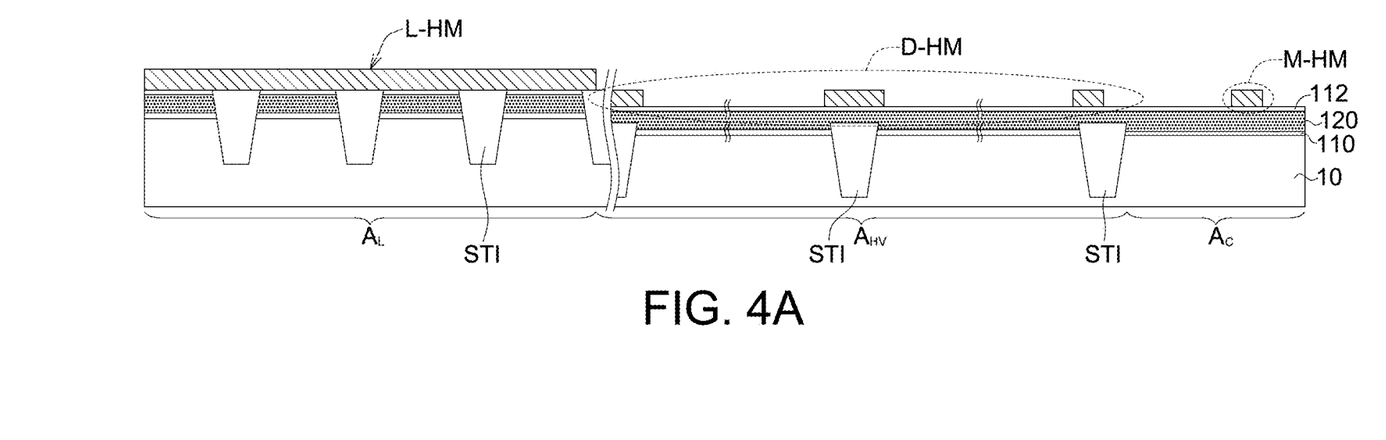
FIG. 4A-FIG. 4G illustrate one method for fabricating a semiconductor device according to the first embodiment of the present disclosure.
Figure 4B:
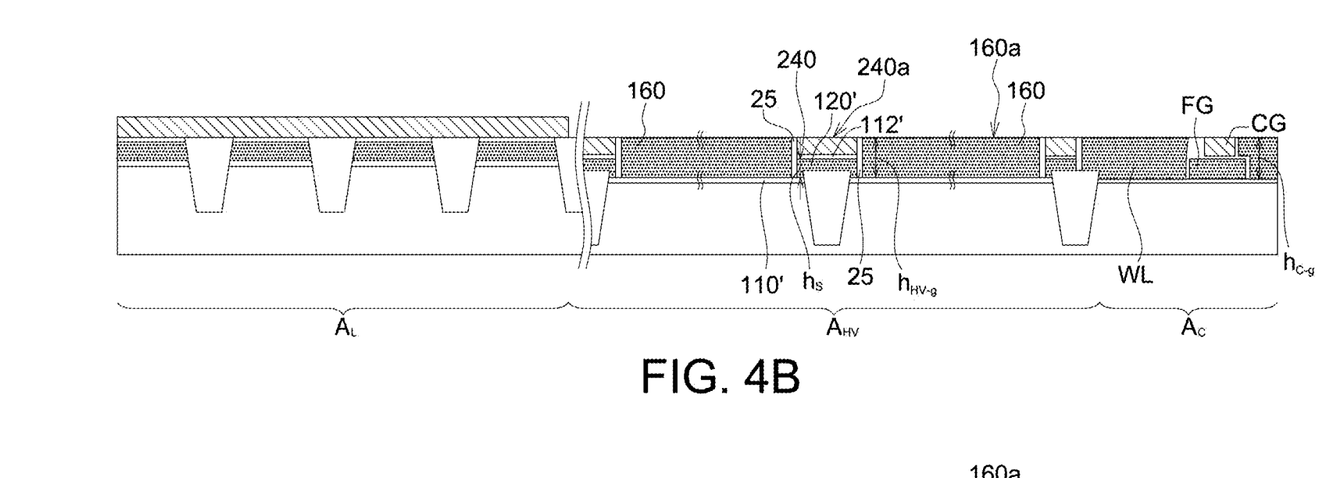
Figure 4C:
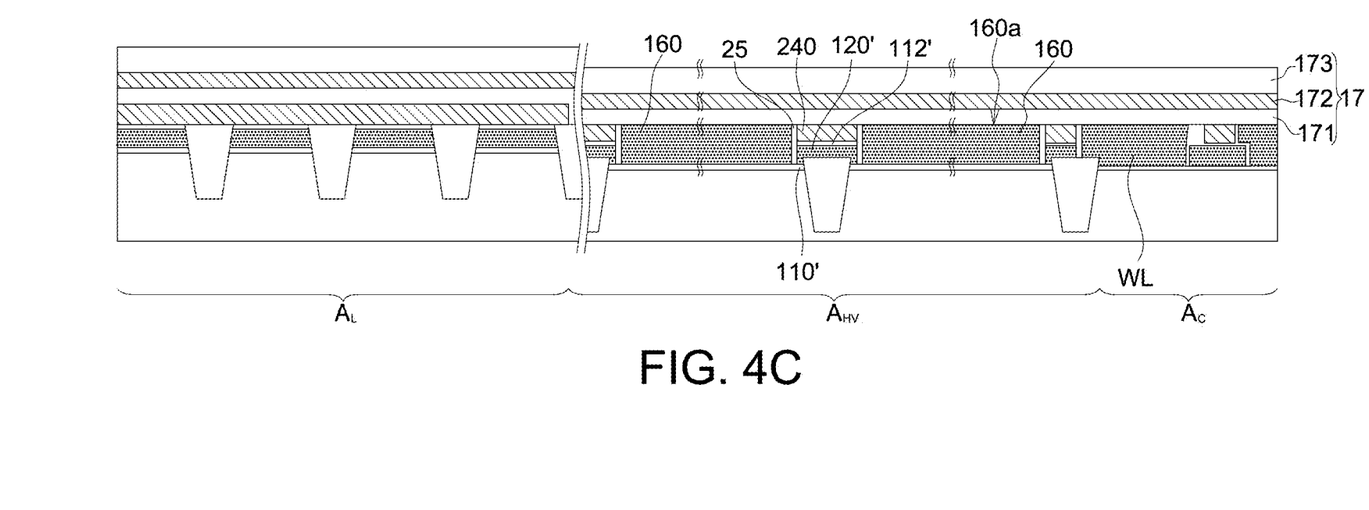
Figure 4D:
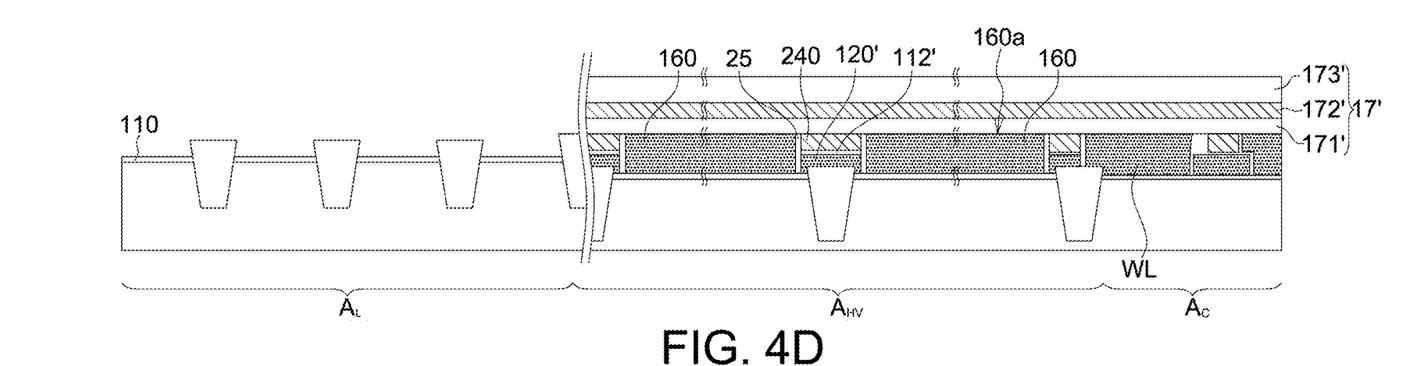
Figure 4E:
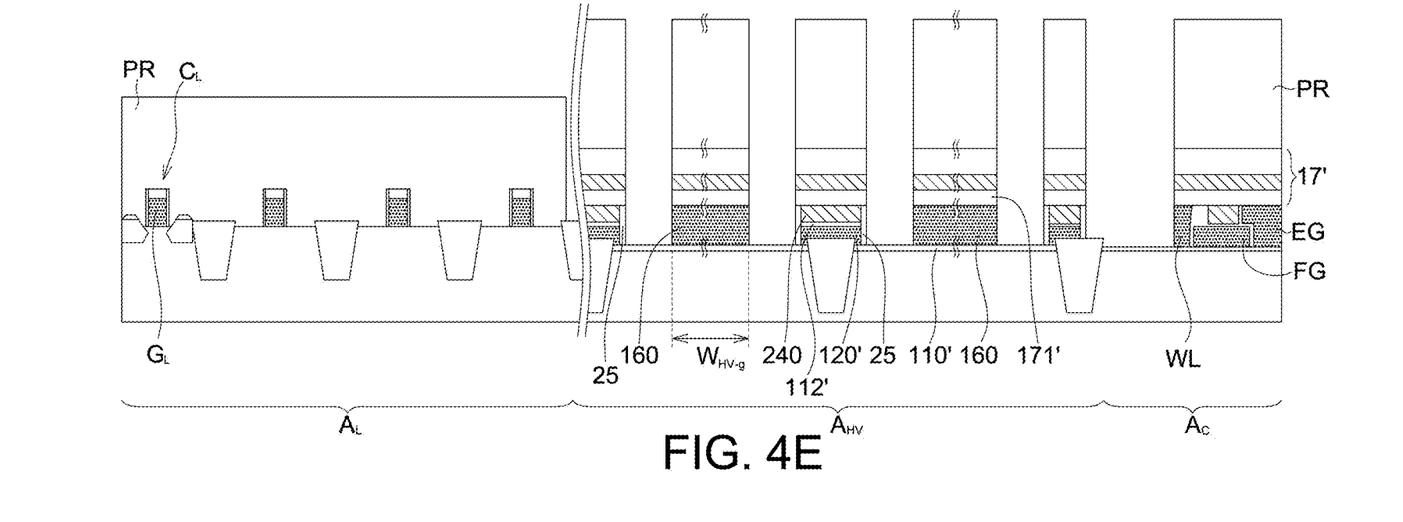
Figure 4F:
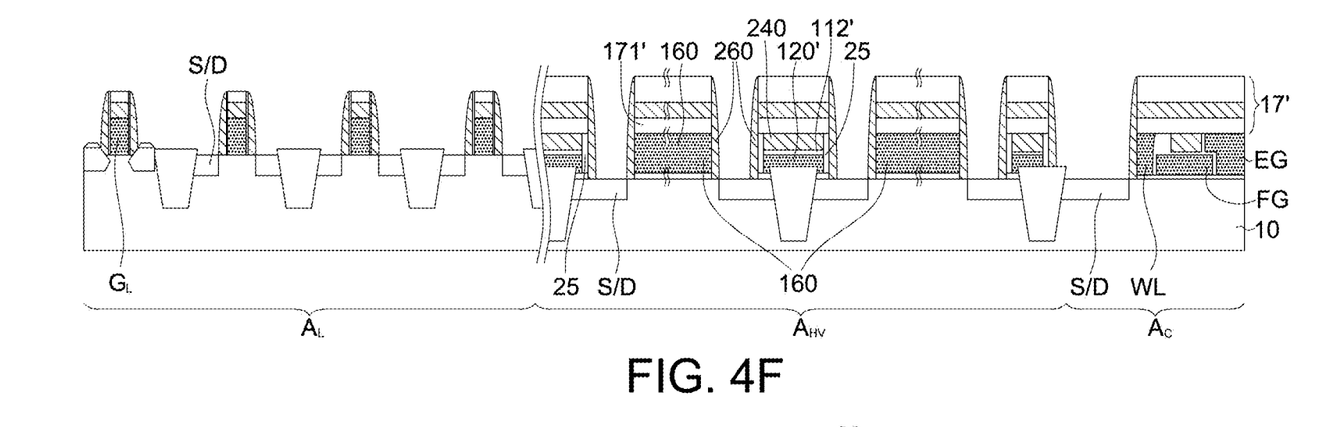
Figure 4G:
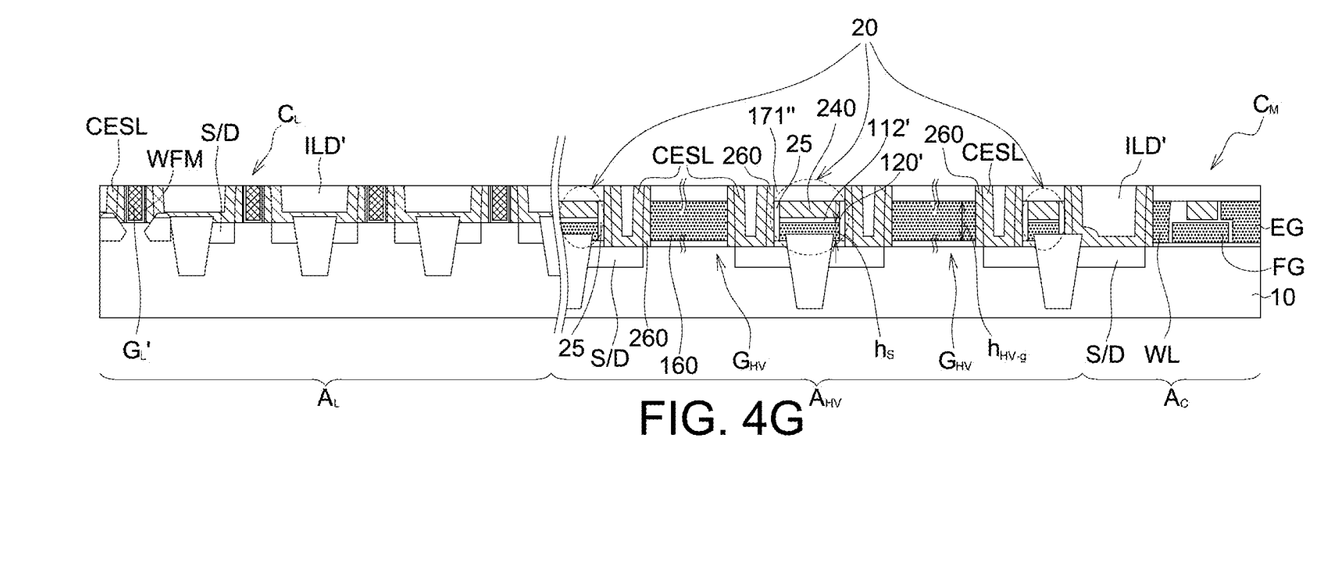

FIG. 4A-FIG. 4G illustrate one method for fabricating a semiconductor device according to the first embodiment of the present disclosure. As shown in FIG. 4A, a substrate 10 having a logic region $A_L$, a high-voltage (HV) region $A_{HV}$ and a memory cell region $A_C$ is provided, wherein a stack having a first semiconductor layer 120 (ex: polysilicon) disposed between a first insulating layer 110 and a second insulating layer 112 (such as the oxide layers) is formed above the substrate 10. Also, a combination of hardmask patterns for the different regions (ex: including the hardmask pattern L-HM in the logic region $A_L$, the dummy hardmask patterns D-HM in the HV region $A_{HV}$ and the hardmask pattern M-HM in the memory cell region $A_C$; made of silicon nitride for example) is disposed above for defining related components. Also, several shallow trench isolations (STI) are formed within the substrate 10 for formation of integrated circuit isolations as known in the art. In FIG. 4A, dummy hardmask patterns D-HM (ex: SiN hardmask patterns) are disposed in the HV region $A_{HV}$, and a hardmask pattern M-HM is disposed in the memory cell region $A_C$ for defining position of a floating gate (FG) of a flash memory cell later.

Afterwards, definition of a WL height of the flash memory cell in the memory cell region $A_C$ is conducted. In one embodiment, during this procedure, the layers in FIG. 4A (ex: the first semiconductor layer 120 and the second insulating layer 112) are patterned by the hardmasks (ex: the dummy hardmask patterns D-HM and the hardmask pattern M-HM) to form multilayer stacks, wherein one of the multilayer stacks in the HV region $A_{HV}$ comprises a patterned first polysilicon layer 120' (as the semiconductor portion), a patterned second insulating layer 112' and a dummy HM 240 functions as a HV dummy pattern. Subsequently, the related spacers are formed on sidewalls of the HV dummy pattern, such as forming the first spacers (ex: oxide spacers 25) on the sidewalls of the multilayer stack (comprising 120'/112'/240), as shown in FIG. 4B. Then, another semiconductor layer (ex: polysilicon) is deposited, followed by steps of WL CMP and WL etching back until the height of the WL (ex: made by the second semiconductor layer) of the flash memory cell in the memory cell region $A_C$ is formed. After this planarization procedure, the height of WL of the flash memory cell would be determined as the height of the second semiconductor layer 160 shown in FIG. 4B. In one embodiment, the semiconductor layer is planarized until a top surface 160a of the second semiconductor layer 160 (ex: polysilicon layer) is substantially aligned with a top surface 240a of the dummy HM 240. Also, after steps of WL fabrication of the flash memory cell as shown in FIG. 4B, a HV dummy pattern in the HV region at least comprising a short semiconductor portion 120' and a dummy HM 240 above the semiconductor portion (ex: 120') is also created.

Afterwards, an insulation stack such as an hardmask-stack 17 (ex: the oxide layer 171, the nitride layer 172 and the oxide layer 173) is deposited in the logic region $A_L$, the high-voltage (HV) region $A_{HV}$ and the memory cell region $A_C$, as shown in FIG. 4C (blanket disposition).

Then, fabrication of logic cells in the logic region $A_L$ is performed. In one example, as shown in FIG. 4D, all of the layers in the logic region are removed except for the first insulating layer 110 (ex: oxide layer) on the substrate 10. Meanwhile, the HV region $A_{HV}$ and the memory cell region $A_C$ are protected during fabrication of the logic cells.

Afterwards, the logic cells $C_L$ with complete profiles having the polysilicon logic gates $G_L$ with sufficient gate height are re-built, as shown in the FIG. 4E. After fabricating the logic cells $C_L$ in the logic region $A_L$, formation of the memory cells and a HV gate pattern are performed.

As shown in the FIG. 4E, an etching mask such as a patterned photoresist PR layer is provided for proceeding the WL etching to define the memory cell in the memory cell region $A_C$ and define the HV gate pattern in the HV region $A_{HV}$ simultaneously. Noted that the logic cells $C_L$ in the logic region $A_L$ are covered (ex: by an un-patterned photoresist PR layer) during fabrications of the memory cells and the HV gate pattern. In the HV region $A_{HV}$ as shown in FIG. 4E, the second semiconductor layer 160 is etched by using the patterned photoresist PR layer to define the width ($W_{HV-g}$) of the HV gate electrode of the HV gate pattern on the substrate 10. Also, in one embodiment, a memory cell comprising a wordline WL and an erase gate EG positioned at two sides of the floating gate FG is illustrated herein for exemplification (not for limitation).

Then, the photoresist PR layer is removed, and a blanket formation of silicides is conducted, followed by forming the nitride spacers 260 (such as SiN) on the structures formed at the logic region $A_L$, the HV region $A_{HV}$ and the memory cell region $A_C$, as shown in FIG. 4F.

After formation of source and drain (S/D) and the nitride spacers 260, a replacement metal gate process for replacing the polysilicon gate portions in the logic gates $G_L$ of the logic cells $C_L$ is conducted, and one of possible procedures is described below.

In one example, a contact etching stop layer CESL (such as a SiN layer; wherein the contact etching stop layer CESL and the nitride spacers 260 could have the same material) is conformably deposited on the structures formed at the logic region $A_L$, the HV region $A_{HV}$ and the memory cell region $A_C$ (as shown in FIG. 4F), followed by depositing a thick inter-layer dielectric layer (not shown). The thick inter-layer dielectric layer and the CESL are partially removed by CMP until the polysilicon gate portions in the logic gates $G_L$ are exposed. Afterwards, the polysilicon gate portions in the logic gates $G_L$ are removed for forming the gate trenches (not shown); and then, a work-function metal layer WFM is deposited in each of the gate trenches, and a low-resistance conductive layer (ex: Al) is deposited for filling the gate trenches, followed by CMP to form the metal gates $G_L'$ of the logic cells $C_L$. FIG. 4G shows the metal gates $G_L'$ of the logic cells $C_L$, the HV dummy patterns 20 and the HV gate structures $G_{HV}$, and the memory cell $C_M$ formed in the patterned thick inter-layer dielectric layer ILD' after CMP. As shown in FIG. 4G, a height $h_S$ of the semiconductor portion 120' is smaller than a height $h_{HV-g}$ of a HV gate electrode of the HV gate structure $G_{HV}$ in the first embodiment, such as smaller than half of the height $h_{HV-g}$ of the HV gate electrode. In one example, the height $h_S$ of the semiconductor portion 120' (or the height $h_{ss}$ of the semiconductor small section 121 in other embodiments) is (but not limited to) about 200 Å, and the height $h_{HV-g}$ of the HV gate electrode is (but not limited to) about 450 Å. Also, in one example, a height $h_{C-g}$ of a memory cell gate and a height $h_{HV-g}$ of a HV gate electrode could be substantially the same.

Figure 5:
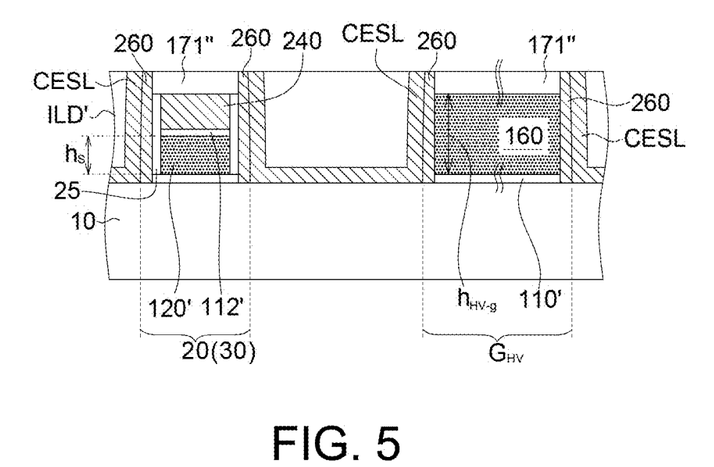
FIG. 5 illustrates enlarging portions of the HV dummy pattern 20 and the HV gate structure $G_{HV}$ along a cross-sectional line 5-5 of FIG. 3 according to the first embodiment of the present disclosure.

FIG. 5 illustrates enlarging portions of the HV dummy pattern 20 and the HV gate structure $G_{HV}$ along a cross-sectional line 5-5 of FIG. 3 according to the first embodiment of the disclosure. According to the first embodiment, the HV dummy pattern 20 at least comprises a multilayer stack having a semiconductor portion (such as polysilicon portion; ex: a patterned first polysilicon layer 120' as shown in FIG. 4G and FIG. 5) in form of a continuous layer (FIG. 3) and a dummy HM stack (ex: the patterned second insulating layer 112' and the dummy HM 240 as shown in FIG. 4G and FIG. 5) disposed on the semiconductor portion. In one example, besides the multilayer stack as described above, the HV dummy pattern 20 in the HV region would further comprise the oxide spacers 25 formed on sidewalls of the multilayer stack, a patterned oxide layer 171" on the dummy HM 240 (after forming the ILD' as shown in FIG. 4G), the nitride spacers 260 formed on the sidewalls of the oxide spacers 25, and the contact etching stop layer CESL formed on (sidewalls of) the nitride spacers 260. Thus, for a HV dummy pattern 20 of the first embodiment, the dummy HM stack disposed on the semiconductor portion (ex: the patterned first polysilicon layer 120') may include several insulating layers, such as the patterned second insulating layer 112', the dummy HM 240 (ex: SiN) and the patterned oxide layer 171". The semiconductor portion (ex: the patterned first polysilicon layer 120') of the HV dummy pattern 20 is enclosed by several insulating layers such as the oxide layers and the nitride layers; therefore, the electrical performances of the application device would not be effected by the existence of the HV dummy patterns 20 in the final product.

Noted that the memory cell region of an embodied semiconductor device may comprise plural flash memory cells, and the logic region may comprise plural logic transistors with 28 nm high-k metal gate (HKMG)), and the related cells and gates in the different regions with certain numbers of the drawings are only for illustration (not for limitation). Also, the sizes of the related elements in the drawings are not necessarily proportional to the actual product of practical applications.

Second Embodiment

Figure 6:
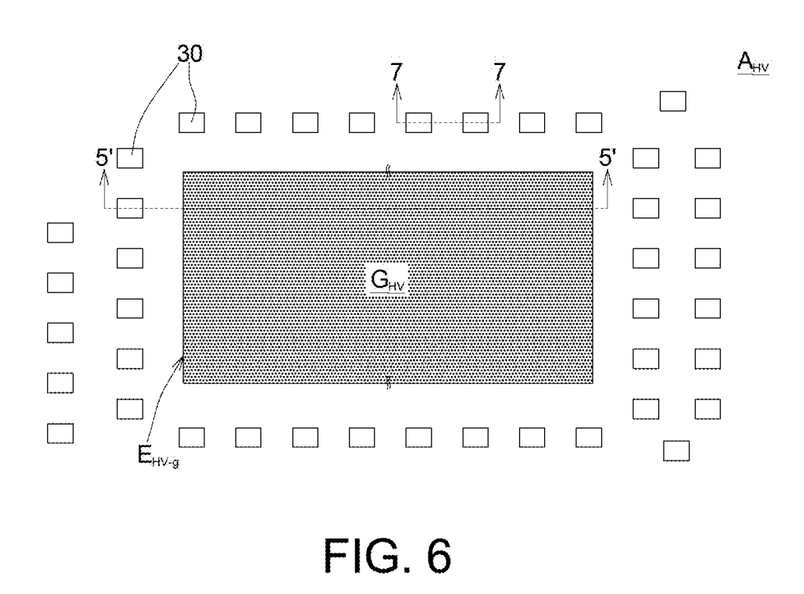
FIG. 6 is a top view showing a HV gate structure and a HV dummy pattern in the HV region of a semiconductor device according to the second embodiment of the disclosure.

FIG. 6 is a top view showing a HV gate structure and a HV dummy pattern in the HV region of a semiconductor device according to the second embodiment of the disclosure. Similar to the first embodiment, a plurality of HV dummy patterns of the second embodiment distributed in the HV region is also positioned outside the HV gate structure $G_{HV}$ (one HV gate structure $G_{HV}$ is exemplified for simple illustration in the second embodiment; however, a HV region in practical application comprises plural HV gate structures), and the HV dummy patterns are spaced apart from the edges $E_{HV-g}$ of the HV gate structure $G_{HV}$. Different from a continuous semiconductor layer (as the semiconductor portion) of the HV dummy pattern as depicted in the first embodiment, the HV dummy patterns of the second embodiment are several dummy structures 30 discretely distributed in the HV region $A_{HV}$, as shown in FIG. 6. The method for fabricating a semiconductor device according to the second embodiment is similar to that of the first embodiment. Please refer to FIG. 4A-FIG. 4G for the references, and the procedures in details are not redundantly repeated. Also, the cross-sectional views of each dummy structure 30 and the HV gate structure $G_{HV}$ of the second embodiment could be identical to the configuration shown in FIG. 5. Thus, FIG. 5 is also illustrating enlarging portions of one dummy structure 30 and one HV gate structure $G_{HV}$ of the second embodiment along a cross-sectional line 5'-5' of FIG. 6.

Figure 7:
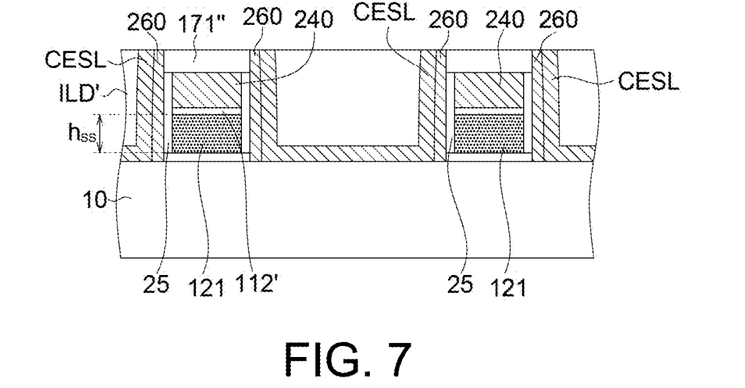
FIG. 7 illustrates enlarging portions of two dummy structures 30 along a cross-sectional line 7-7 of FIG. 6.

FIG. 7 illustrates enlarging portions of two dummy structures 30 along a cross-sectional line 7-7 of FIG. 6. The identical and/or similar elements of the embodiments are designated with the same and/or similar reference numerals. As shown in FIG. 7, each of the dummy structures 30 of the second embodiment at least comprises a semiconductor small section 121 (ex: in form of a bump or strip or other shape; such as a polysilicon bump in a height of about 200 Å) and a dummy HM stack disposed on the semiconductor small section 121. That is, the semiconductor portion (i.e. the patterned first polysilicon layer 120' as shown in FIG. 5) in the form of a continuous layer as described in the first embodiment can be replaced by several semiconductor small sections 121 of the second embodiment as shown in FIG. 7. Also, a height $h_{ss}$ of the semiconductor small section 121 is smaller than a height $h_{HV-g}$ of a HV gate electrode of the HV gate structure $G_{HV}$ in the second embodiment. Also, the configuration of a HV gate structure $G_{HV}$ according to the second embodiment could be referred to FIG. 5, and the details are not redundantly repeated.

Third Embodiment

Figure 8:
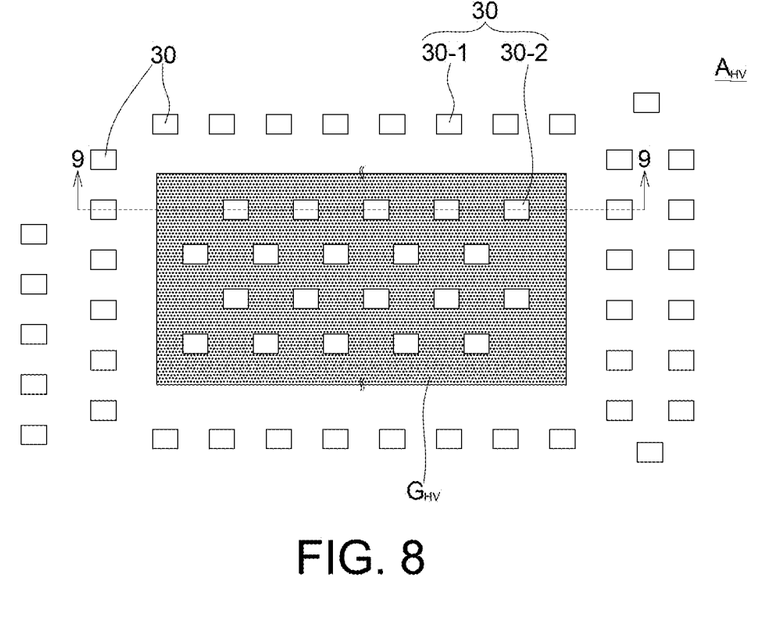
FIG. 8 is a top view showing a HV gate structure and a HV dummy pattern (comprising plural dummy structures discretely distributed) in the HV region of a semiconductor device according to the third embodiment of the disclosure.

FIG. 8 is a top view showing a HV gate structure and a HV dummy pattern (comprising plural dummy structures discretely distributed) in the HV region of a semiconductor device according to the third embodiment of the disclosure. In the third embodiment, a HV dummy pattern comprises plural dummy structures 30 discretely distributed in the HV region $A_{HV}$, wherein those dummy structures 30 are disposed in a large area of the HV region $A_{HV}$, and include the dummy structures 30-1 disposed outside the HV gate structure(s) $G_{HV}$ and the dummy structures 30-2 disposed inside the HV gate structure(s) $G_{HV}$, as shown in FIG. 8. From a top view of the substrate, whether the dummy structures 30 are disposed outside or inside (within) the HV gate structure(s) $G_{HV}$, all of the dummy structures 30 are spaced apart from the edges $E_{HV-g}$ of the HV gate structure(s) $G_{HV}$.

One of the applicable methods for fabricating a semiconductor device according to the third embodiment can be obtained by slightly modifying the method of the first embodiment (FIG. 4A-FIG. 4G), wherein a dummy hardmask pattern D-HM (ex: a SiN hardmask pattern) as shown in FIG. 4A is designed for further including a pattern for forming the semiconductor small sections 121 (ex: short polysilicon) and the dummy HM stacks respectively disposed on the semiconductor small sections 121 inside the HV gate structure(s) $G_{HV}$.

Figure 9:
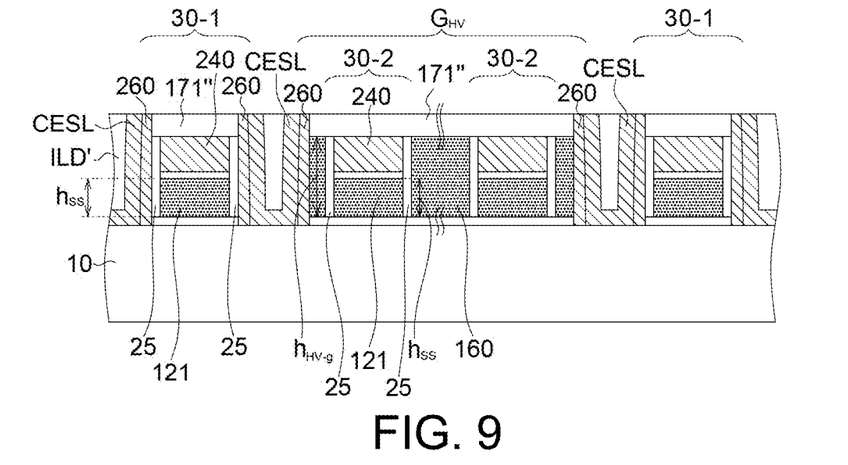
FIG. 9 illustrates enlarging portions of two dummy structures outside the HV gate structure and several dummy structures inside the HV gate structure along a cross-sectional line 9-9 of FIG. 8.

FIG. 9 illustrates enlarging portions of two dummy structures 30-1 outside the HV gate structure and several dummy structures 30-2 inside the HV gate structure along a cross-sectional line 9-9 of FIG. 8. The identical and/or similar elements of the embodiments (ex: FIG. 9 and FIG. 7) are designated with the same and/or similar reference numerals for clear illustration. Please refer to the descriptions related to FIG. 7 in the second embodiment for the configuration details of the dummy structure 30-1 distributed outside the HV gate structure $G_{HV}$, which are not redundantly repeated. Also, each of the dummy structures 30-2 inside the HV gate structure $G_{HV}$ of the third embodiment may comprise a semiconductor small section 121 (ex: in form of a bump or a strip or other shape), a patterned second insulating layer 112', a dummy HM 240 and the oxide spacers 25. Noted that no nitride spacers 260 and no CESL are formed on the dummy structure 30-2 inside the HV gate structure $G_{HV}$ since the steps of forming the nitride spacers 260 and the CESL are performed after the dummy structures 30-2 have been embedded in the second semiconductor layer 160 for defining the HV gate electrode (please see FIG. 4A-FIG. 4B for the reference).

Similar to the configuration provided by the second embodiment, each of the dummy structures 30-1 and 30-2 in the third embodiment is exemplified by a combination at least having a semiconductor small section 121 (such as a polysilicon bump or strip in a height of about 200 Å)

disposed above the substrate 10 and a dummy HM stack disposed on the semiconductor small section 121, as shown in FIG. 9. Also, the heights $h_{SS}$ of the semiconductor small section 121 of the dummy structures 30-1 and 30-2 are smaller than a height $h_{HV-g}$ of a HV gate electrode of the HV gate structure $G_{HV}$ according to the third embodiment.

Although there are dummy structures 30-2 formed inside the HV gate structures, the top view of the HV gate structure $G_{HV}$ as depicted in FIG. 8 (as well as FIG. 10 of the fourth embodiment described later) clearly shows that the second semiconductor layer 160 (FIG. 8) for forming the HV gate electrode of the HV gate structure $G_{HV}$ is still a continuous layer, wherein the dummy structures 30-2 are isolated (and insulated) from the second semiconductor layer 160 by the oxide spacers 25. Since the dummy structures 30-2 of the embodiment are quite small (ex: less than 1 micrometer in width for actual applications) comparing to the large area of the HV gate structure $G_{HV}$ (ex: several micrometers in width for actual applications), the HV gate structure(s) $G_{HV}$ of the embodiment still provides good electrical characteristics.

Additionally, the distances between two adjacent dummy structures 30-1 inside the HV gate structure(s) $G_{HV}$ can be the same or different. Similarly, the distances between two adjacent dummy structures 30-2 outside the HV gate structure(s) $G_{HV}$ can be the same or different. Also, the arrangements of the dummy structures 30-1 and 30-2 can be identical, or similar or completely different, depending on actual requirements of practical applications. The disclosure has no particularly limitation thereto.

Fourth Embodiment

Figure 10:
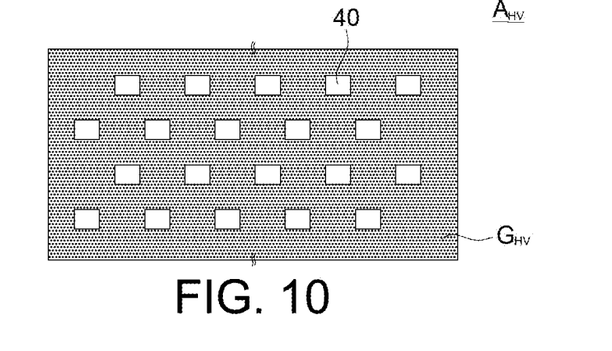
FIG. 10 is a top view showing a HV gate structure and a HV dummy pattern in the HV region of a semiconductor device according to the fourth embodiment of the disclosure, wherein the HV dummy pattern comprises plural dummy structures discretely distributed inside the HV gate structure.

FIG. 10 is a top view showing a HV gate structure and a HV dummy pattern in the HV region of a semiconductor device according to the fourth embodiment of the disclosure, wherein the HV dummy pattern comprises plural dummy structures 40 discretely distributed inside the HV gate structure(s) $G_{HV}$. Please refer to the dummy structure 30-2 of FIG. 9 for the configuration of the dummy structure 40 positioned inside (within) the HV gate structure $G_{HV}$. The details are not redundantly repeated.

Fifth Embodiment

Figure 11:
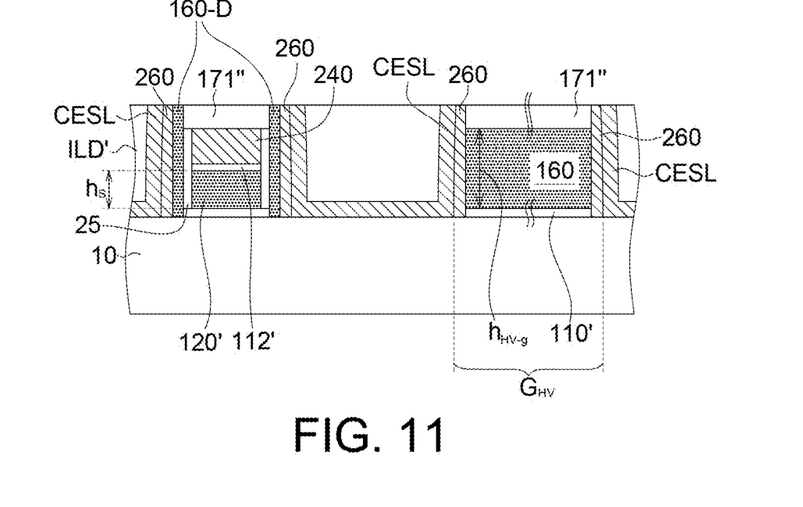
FIG. 11 illustrates enlarging portions of a HV gate structure and a dummy structure outside the HV gate structure according to the fifth embodiment of the disclosure.

Due to the process variations, the configurations of the HV dummy patterns (ex: 20/30/30-1/30-2) of the embodiments can be slightly different such as addition of extra spacers comprising semiconductor material to the HV dummy patterns. FIG. 11 illustrates enlarging portions of a HV gate structure and a dummy structure outside the HV gate structure according to the fifth embodiment of the disclosure.

Please refer back to FIG. 4E, which illustrates the second semiconductor layer 160 is etched by using the patterned photoresist PR to define the width ($W_{HV-g}$) of the HV gate electrode of the HV gate pattern on the substrate 10. If the process variation occurs in this etching step, such as the patterned photoresist PR being slightly shifted or modified, the material of the second semiconductor layer 160 would be remained on the oxide spacers 25 such as the semiconductor spacers 160-D shown in FIG. 11, wherein the oxide spacers 25 can be regarded as first spacers and the semiconductor spacers 160-D can be regarded as second spacers. Accordingly, the HV dummy pattern of the semiconductor device of the fifth embodiment would comprise the first spaces having at least a dielectric material (ex: oxides), and the second spacers made by a semiconductor material (ex: polysilicon).

Configurations of other related layers of the HV dummy pattern of the semiconductor device according to the fifth embodiment have been described above (ex: in the first embodiment), and the details are not redundantly described.

According to the aforementioned description, the dummy hardmask patterns D-HM (ex: SiN hardmask patterns) are disposed in the HV region during definition of the floating gates in the memory cell region, and it is no need to form an extra cap oxide layer in the HV region as taught by conventional method. The method of the embodiment also leads to a HV dummy pattern remained in the HV region for the final configuration of the semiconductor device. However, the semiconductor portion (ex: a continuous semiconductor layer in the first embodiment, or comprising plural semiconductor small sections in the second to fourth embodiments) of the HV dummy pattern is structurally and electrically isolated from the HV gate electrode of the HV gate structure (i.e. the top surface, the bottom surface and the sidewalls of the semiconductor portion 120'/the semiconductor small sections 121 are covered by insulating layers), the HV gate structures $G_{HV}$ of the embodiments still provides good electrical characteristics.

Other embodiments with different configurations of known elements in the device/apparatus can be applicable, and the arrangement depends on the actual needs of the practical applications. It is, of course, noted that the configurations of figures are depicted only for demonstration, not for limitation. It is known by people skilled in the art that the shapes or positional relationship of the constituting elements and the procedure details could be adjusted according to the requirements and/or manufacturing steps of the practical applications.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor device, comprising:
    a substrate having a high-voltage (HV) region;
    HV gate structures formed in the HV region of the substrate;
    a HV dummy pattern disposed in the HV region, and the HV dummy pattern comprising at least a semiconductor portion and a dummy hardmask (HM) stack disposed on the semiconductor portion,
    wherein a height ($h_S$) of the semiconductor portion of the HV dummy pattern is smaller than a height ($h_{HV-g}$) of a HV gate electrode of one of the HV gate structures.

2. The semiconductor device according to claim 1, wherein the semiconductor portion is a continuous semiconductor layer.

3. The semiconductor device according to claim 2, wherein the HV dummy pattern is positioned outside the HV gate structures and surrounds the HV gate structures.

4. The semiconductor device according to claim 1, wherein the HV dummy pattern comprises plural dummy structures discretely distributed in the HV region, and each of the dummy structures at least comprises:
    a semiconductor small section disposed above the substrate; and
    the dummy HM stack disposed on the semiconductor small section.

5. The semiconductor device according to claim 4, wherein the plural dummy structures are spaced apart from edges of the HV gate structures $G_{HV}$ from a top view of the substrate.

6. The semiconductor device according to claim 4, wherein the plural dummy structures are discretely distributed outsides the HV gate structures and surround the HV gate structures.

7. The semiconductor device according to claim 4, wherein the plural dummy structures are discretely distributed insides the HV gate structures.

8. The semiconductor device according to claim 4, wherein the plural dummy structures distributed in the HV region is a dot pattern or a stripe pattern from a top view of the substrate.

9. The semiconductor device according to claim 1, wherein one of the HV gate structures comprises:
a HV gate insulating layer disposed above the substrate; and
the HV gate electrode disposed on the HV gate insulating layer,
wherein the semiconductor portion of the HV dummy pattern and the HV gate electrode comprise the same material.

10. The semiconductor device according to claim 1, wherein a top surface of the semiconductor portion is positioned at a lower horizontal level than a top surface of the HV gate electrode.

11. The semiconductor device according to claim 10, wherein the substrate has a logic region comprising one logic gate, and a top surface of the logic gate is aligned with the top surface of the HV gate electrode.

12. The semiconductor device according to claim 1, wherein the dummy HM stack is a multi-layer stack at least comprising a nitrite layer and an oxide layer disposed on the nitrite layer.

13. The semiconductor device according to claim 1, wherein the height ($h_S$) of the semiconductor portion is smaller than half of the height ($h_{HV-g}$) of the HV gate electrode.

14. The semiconductor device according to claim 1, wherein the HV gate electrode of each of the HV gate structures comprises metal or polysilicon.

15. The semiconductor device according to claim 1, wherein the semiconductor portion comprises polysilicon.

16. The semiconductor device according to claim 1, wherein the semiconductor portion of the HV dummy pattern is structurally and electrically isolated from adjacent one of the HV gate structures.

17. A method for forming a semiconductor device, comprising:
providing a substrate and a first semiconductor layer disposed above the substrate, and the substrate having a high-voltage (HV) region;
disposing a patterned hardmask (HM) above the first semiconductor layer;
defining a HV dummy pattern in the HV region by using the patterned HM, wherein the HV dummy pattern comprises at least a semiconductor portion above the substrate and a dummy HM stack disposed on the semiconductor portion;
disposing a second semiconductor layer;
providing an etching mask in the HV region, and defining the second semiconductor layer by using the etching mask to form HV gate structures on the substrate,
wherein a height ($h_S$) of the semiconductor portion of the HV dummy pattern is smaller than a height ($h_{HV-g}$) of a HV gate electrode of one of the HV gate structures.

18. The method according to claim 17, wherein the HV dummy pattern comprises plural dummy structures discretely distributed in the HV region, and each of the dummy structures at least comprises a semiconductor small section disposed above the substrate and the dummy HM stack disposed on the semiconductor small section,
wherein the method comprises disposing the second semiconductor layer in spaces between the dummy structures.

19. The method according to claim 18, further comprising forming oxide spacers on sidewalls of the dummy structures after defining the dummy structures.

20. The method according to claim 19, after forming the HV gate structures using the etching mask, polysilicon spacers are further formed on sidewalls of the oxide spacers of the dummy structures.

21. The method according to claim 18, wherein disposing the second semiconductor layer comprises:
depositing the second semiconductor layer on the dummy structures and fully filling the spaces between the dummy structures; and
planarizing the second semiconductor layer until a top surface of the second semiconductor layer substantially aligned with a top surface of the dummy HM stack.

22. The method according to claim 18, before providing the etching mask in the HV region, the method further comprising:
providing an insulation stack on the dummy structures and the second semiconductor layer,
wherein the etching mask is disposed on the insulation stack.

23. The method according to claim 17, wherein the substrate has a memory cell region with memory cells, wherein a memory cell gate height is substantially the same as a height of a HV gate electrode of each of the HV gate structures after planarization of the second semiconductor layer to form the HV gate structures.

24. The method according to claim 17, wherein after forming the HV gate structures, the HV dummy pattern distributed in the HV region is spaced apart from edges of the HV gate structures from a top view of the substrate.

25. A semiconductor device, comprising:
a substrate having a high-voltage (HV) region;
HV gate structures formed in the HV region of the substrate;
a HV dummy pattern disposed in the HV region, and the HV dummy pattern comprising:
a semiconductor portion disposed above the substrate;
a dummy hardmask (HM) stack disposed on the semiconductor portion;
first spacers disposed on sidewalls of the dummy HM stack and sidewalls of the semiconductor portion; and
second spacers disposed on sidewalls of the first spacers,
wherein the first spacers comprise at least a dielectric material, and the second spacers comprise a semiconductor material.

26. The semiconductor device according to claim 25, wherein a height of the semiconductor portion of the HV dummy pattern is smaller than a height of a HV gate electrode of one of the HV gate structures.

27. The semiconductor device according to claim 25, the first spacers comprise oxide spacers, and the second spacers comprise polysilicon spacers.

\* \* \* \* \*